(12) United States Patent
Onzuka et al.

(10) Patent No.: US 11,626,277 B2
(45) Date of Patent: Apr. 11, 2023

(54) SUBSTRATE ALIGNING METHOD, SUBSTRATE RECEIVING METHOD, SUBSTRATE LIQUID PROCESSING METHOD, SUBSTRATE ALIGNING APPARATUS, SUBSTRATE RECEIVING APPARATUS, SUBSTRATE LIQUID PROCESSING APPARATUS, AND SUBSTRATE PROCESSING SYSTEM

(71) Applicant: Tokyo Electron Limited, Tokyo (JP)

(72) Inventors: Keiji Onzuka, Kumamoto (JP); Hirozumi Hoshino, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 439 days.

(21) Appl. No.: 16/945,976

(22) Filed: Aug. 3, 2020

(65) Prior Publication Data
US 2020/0365393 A1   Nov. 19, 2020

Related U.S. Application Data

(62) Division of application No. 15/370,042, filed on Dec. 6, 2016, now Pat. No. 10,770,283.

(30) Foreign Application Priority Data

Dec. 17, 2015  (JP) .............................. JP2015-246086

(51) Int. Cl.
  *H01L 21/67*   (2006.01)
  *H01L 21/02*   (2006.01)
  (Continued)

(52) U.S. Cl.
  CPC .. *H01L 21/02052* (2013.01); *H01L 21/30604* (2013.01); *H01L 21/67781* (2013.01); *H01L 21/68* (2013.01); *H01L 21/683* (2013.01)

(58) Field of Classification Search
  CPC ......... H01L 21/02052; H01L 21/30604; H01L 21/67781; H01L 21/68; H01L 21/683; H01L 21/67017; H01L 21/677; H01L 21/682; H01L 21/67057; H01L 21/6715; H01L 21/67715; H01L 21/6835; H01L 21/67023; H01L 21/67063;
  (Continued)

(56) References Cited

U.S. PATENT DOCUMENTS

2007/0257085 A1   11/2007   Fukuda et al.
2013/0206726 A1   8/2013    Oono
(Continued)

FOREIGN PATENT DOCUMENTS

JP   10-154675 A      6/1998
JP   2007-067334 A    3/2007
(Continued)

*Primary Examiner* — Ermias T Woldegeorgis
(74) *Attorney, Agent, or Firm* — Venjuris, P.C.

(57) ABSTRACT

A substrate aligning method includes receiving a substrate by moving a substrate support from an outside of an outer periphery toward a central portion of the substrate along the substrate; and aligning the substrate such that the substrate support moves from a position different from a position partially upwardly warped along an outer peripheral edge of the substrate and a position partially downwardly warped along the outer peripheral edge of the substrate toward the central portion of the substrate so as to receive the substrate.

4 Claims, 6 Drawing Sheets

(51) Int. Cl.
*H01L 21/306* (2006.01)
*H01L 21/677* (2006.01)
*H01L 21/683* (2006.01)
*H01L 21/68* (2006.01)

(58) Field of Classification Search
CPC ......... H01L 21/67028; H01L 21/67075; H01L 21/67178; H01L 21/67288; H01L 21/673; H01L 21/67303; H01L 21/67309; H01L 21/67383; H01L 21/67712; H01L 21/68764; H01L 21/68707; H01L 21/68771; H01L 21/687; C23C 14/50; C23C 16/458; C23C 16/4583; C30B 25/12
See application file for complete search history.

(56) References Cited

U.S. PATENT DOCUMENTS

2017/0140964 A1  5/2017  Nagata et al.
2017/0287921 A1  10/2017  Lu et al.

FOREIGN PATENT DOCUMENTS

| | | |
|---|---|---|
| JP | 2009-516376 A | 4/2009 |
| JP | 2011-253960 A | 12/2011 |
| JP | 2015-053329 A | 3/2015 |
| JP | 2015-056631 A | 3/2015 |
| WO | 2008-068943 A1 | 6/2008 |

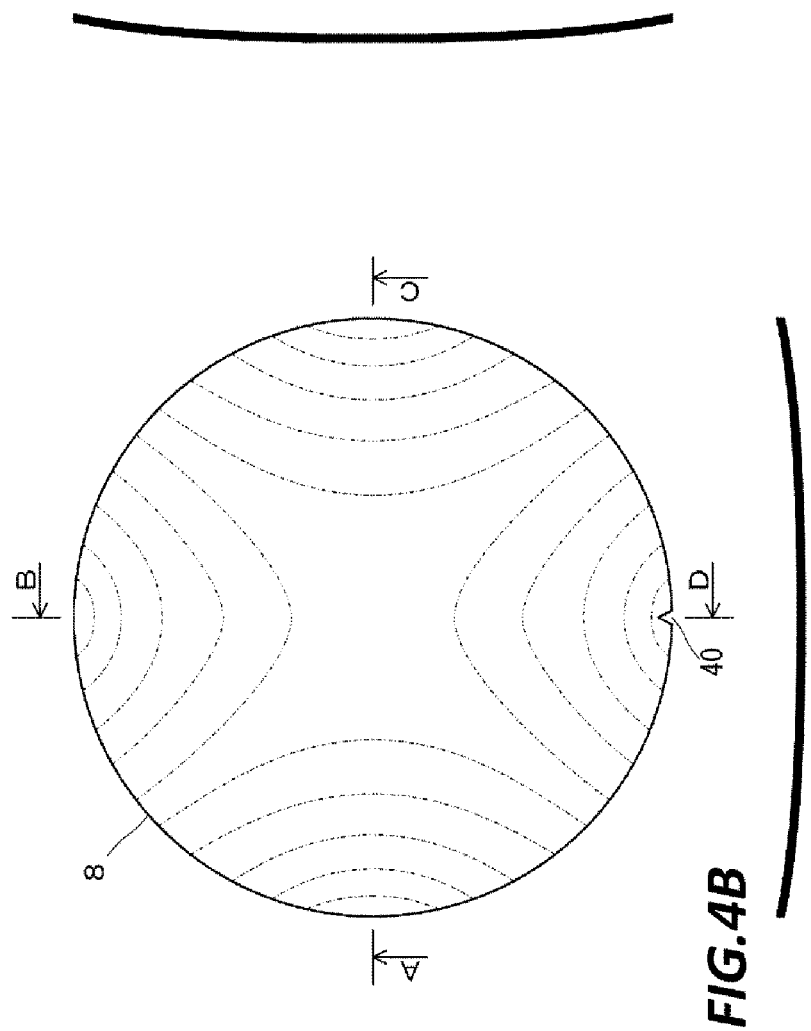

SUBSTRATE ALIGNING METHOD, SUBSTRATE RECEIVING METHOD, SUBSTRATE LIQUID PROCESSING METHOD, SUBSTRATE ALIGNING APPARATUS, SUBSTRATE RECEIVING APPARATUS, SUBSTRATE LIQUID PROCESSING APPARATUS, AND SUBSTRATE PROCESSING SYSTEM

CROSS-REFERENCE TO RELATED APPLICATIONS

This application is a divisional of U.S. patent application Ser. No. 15/370,042, filed on Dec. 6, 2016, which claims priority from Japanese Patent Application No. 2015-246086, filed on Dec. 17, 2015, with the Japan Patent Office, the disclosures of which are incorporated herein in their entireties by reference.

TECHNICAL FIELD

The present disclosure relates to a substrate aligning method, a substrate receiving method, a substrate liquid processing method, a substrate aligning apparatus, a substrate receiving apparatus, a substrate liquid processing apparatus, and a substrate processing system, which are used for processing a plurality of substrates in a state of being aligned at intervals.

BACKGROUND

In manufacturing, for example, semiconductor parts, various processings (e.g., etching or cleaning) are performed on a substrate such as, for example, a semiconductor wafer or a glass substrate by using a substrate processing apparatus.

In the substrate processing apparatus, conveyance or liquid processing is performed in a state where a plurality of substrates are aligned at intervals.

For example, in a substrate processing apparatus disclosed in Japanese Patent Laid-Open Publication No. 2015-056631, a substrate is accommodated in a carrier and conveyed. A plurality of (e.g., 25) substrates are horizontally accommodated in the carrier at vertical intervals. In the substrate processing apparatus, the plurality of substrates accommodated in the carrier are received in twice and delivered to a placing table by using a conveyance device. Thus, a lot is formed with a plurality of (e.g., 50) substrates received in twice on the placing table to collectively process the substrates. Further, in the substrate processing apparatus, the plurality of substrates forming the lot are conveyed to a liquid processing apparatus by using the conveyance device. The substrates, which have been collectively processed in the liquid processing apparatus, are accommodated in the carrier via the placing table by using the conveyance device.

In the conveyance device of the substrate processing apparatus, substrate supports are arranged at intervals in the same manner as the plurality of substrates such that each substrate support supports one substrate. In the conveyance device, the plurality of substrates are simultaneously conveyed (received and delivered) by the plurality of substrate supports each of which is inserted into each of the gaps between the plurality of substrates arranged at intervals.

SUMMARY

The present disclosure provides a substrate aligning method including receiving a substrate by moving a substrate support from an outside of an outer periphery toward a central portion of the substrate along the substrate; and aligning the substrate such that the substrate support moves from a position different from a position partially upwardly warped along an outer peripheral edge of the substrate and a position partially downwardly warped along the outer peripheral edge of the substrate toward the central portion of the substrate so as to receive the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4C are explanatory views illustrating a warped state of the substrate.

DETAILED DESCRIPTION

Figure 1:
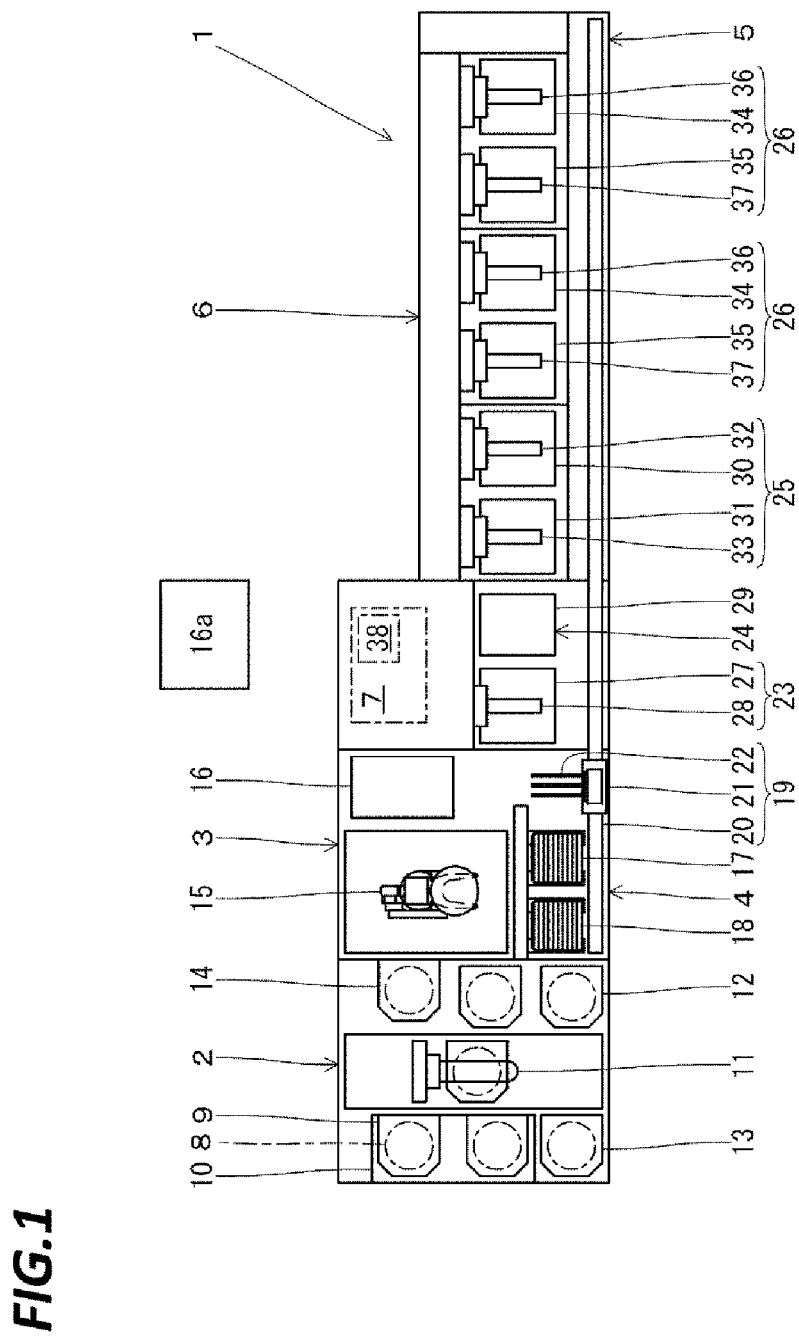
FIG. 1 is an explanatory plan view illustrating a substrate processing system.
Figure 2:
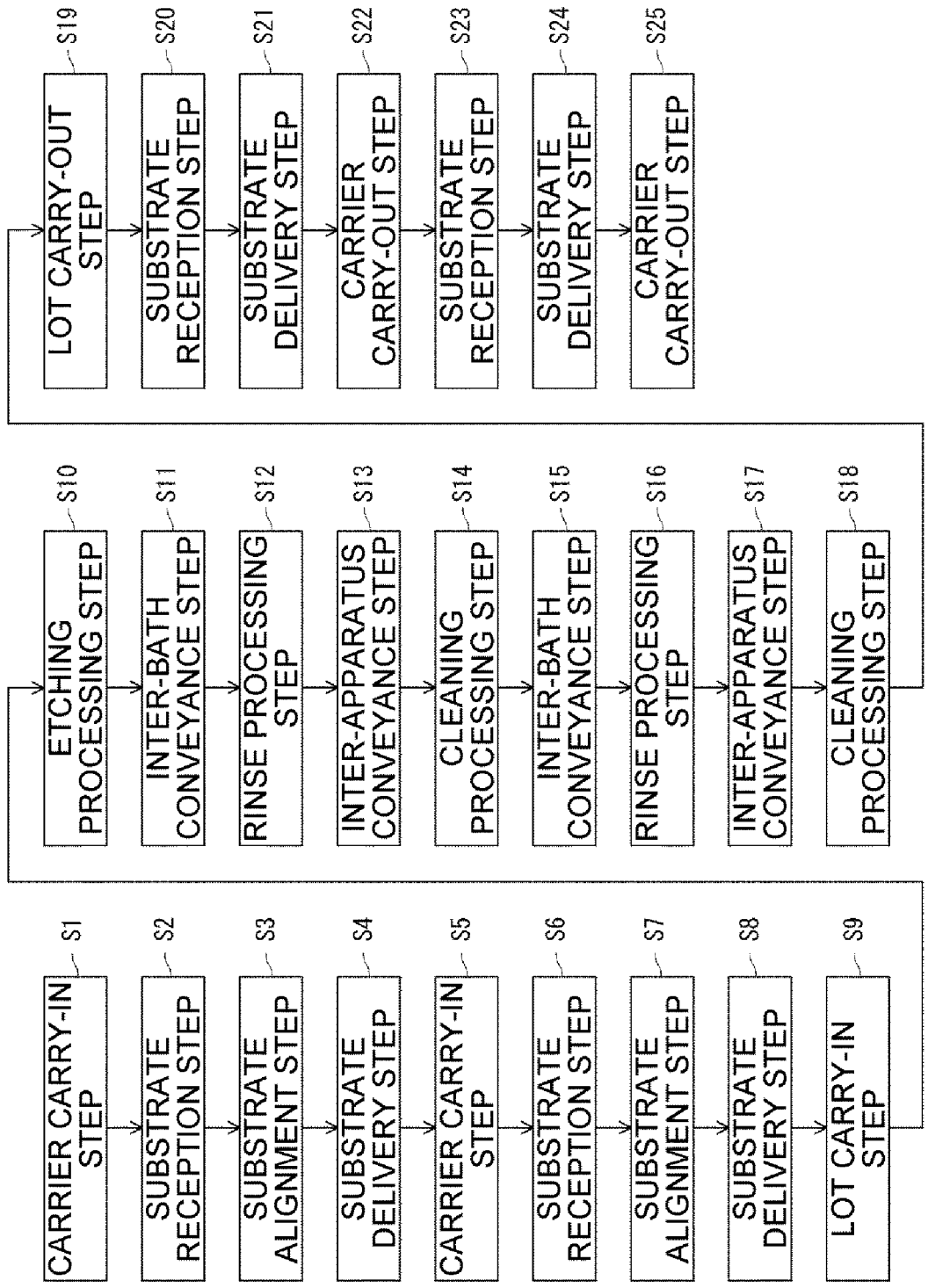
FIG. 2 is an explanatory view illustrating a substrate processing.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

A substrate processed in a substrate processing apparatus may be deformed from a flat state to a partially upwardly or downwardly warped state in the course of various processings.

Therefore, when the warped substrate is disposed, the substrate comes into contact with a substrate support upon being received by the substrate support. Thus, the substrate may not be satisfactorily received.

The present disclosure provides a substrate aligning method including receiving a substrate by moving a substrate support from an outside of an outer periphery toward a central portion of the substrate along the substrate; and aligning the substrate such that the substrate support moves from a position different from a position partially upwardly warped along an outer peripheral edge of the substrate and a position partially downwardly warped along the outer peripheral edge of the substrate toward the central portion of the substrate so as to receive the substrate.

In the above-described substrate aligning method, the substrate is aligned such that the substrate support moves from a position between the partially upwardly warped position and the partially downwardly warped position toward the central portion of the substrate so as to receive the substrate.

In the above-described substrate aligning method, the substrate is deformed in a substantially saddle-shaped curved form in which a portion partially upwardly warped along the outer peripheral edge of the substrate and a portion partially downwardly warped along the outer peripheral edge of the substrate are symmetrically formed.

Further, the present disclosure provides a substrate receiving method including receiving a substrate by moving a substrate support from an outside of an outer periphery toward a central portion of the substrate along the substrate, in which the substrate support is moved from a position different from a position partially upwardly warped along an outer peripheral edge of the substrate and a position partially downwardly warped along the outer peripheral edge of the substrate toward the central portion of the substrate.

In the above-described substrate receiving method, the substrate support is moved from a position between the partially upwardly warped position and the partially downwardly warped position toward the central portion of the substrate.

In the above-described substrate receiving method, the substrate is deformed in a substantially saddle-shaped curved form in which a portion partially upwardly warped along the outer peripheral edge of the substrate and a portion partially downwardly warped along the outer peripheral edge are symmetrically formed.

Further, the present disclosure provides a substrate liquid processing method including collectively immersing a plurality of substrates, which are aligned at intervals, in a processing liquid to process the plurality of substrates, in which the plurality of substrates are immersed in the processing liquid in a state where positions partially upwardly warped along outer peripheral edges of the substrates or positions partially downwardly warped the outer peripheral edges of the substrates are arranged in order.

In the above-described substrate liquid processing method, each of the substrates is deformed in a substantially saddle-shaped curved form in which a portion partially upwardly warped along the outer peripheral edge of the substrate and a portion partially downwardly warped along the outer peripheral edge are symmetrically formed.

The present disclosure provides a substrate aligning apparatus for aligning a substrate received by moving a substrate support along the substrate from an outside of an outer periphery of a substrate toward a central portion, in which the substrate is aligned such that the substrate support moves from a position different from a position partially upwardly warped along an outer peripheral edge and a position partially downwardly warped position along the outer peripheral edge of the substrate toward the central portion of the substrate so as to receive the substrate.

In the above-described substrate aligning apparatus, the substrate is aligned such that the substrate support moves from a position between the partially upwardly warped position and the partially downwardly warped position toward the central portion of the substrate so as to receive the substrate.

In the above-described substrate aligning apparatus, the substrate is deformed in a substantially saddle-shaped curved form in which a portion partially upwardly warped along the outer peripheral edge of the substrate and a portion partially downwardly warped along the outer peripheral edge of the substrate are symmetrically formed.

Further, the present disclosure provides a substrate receiving apparatus for receiving a substrate by moving a substrate support from an outside of an outer periphery toward a central portion of the substrate along the substrate, in which the substrate support is moved from a position different from a position partially upwardly warped along an outer peripheral edge of the substrate and a position partially downwardly warped position along the outer peripheral edge of the substrate toward the central portion of the substrate.

In the above-described substrate receiving apparatus, the substrate support is moved from a position between the partially upwardly warped position and the partially downwardly warped position toward the central portion of the substrate.

In the above-described substrate receiving apparatus, the substrate is deformed in a substantially saddle-shaped curved form in which a portion partially upwardly warped along the outer peripheral edge of the substrate and a portion partially downwardly warped along the outer peripheral edge are symmetrically formed.

Further, the present disclosure provides a substrate liquid processing for collectively immersing a plurality of substrates, which are aligned at intervals, in a processing liquid to process the plurality of substrates, in which the plurality of substrates are immersed in the processing liquid in a state where positions partially upwardly warped along outer peripheral edges of the substrates or positions partially downwardly warped the outer peripheral edges of the substrates are arranged in order.

In the above-described substrate liquid processing apparatus, each of the substrates is deformed in a substantially saddle-shaped curved form in which a portion partially upwardly warped along the outer peripheral edge of the substrate and a portion partially downwardly warped along the outer peripheral edge are symmetrically formed.

The present disclosure provides a substrate processing system including a substrate aligning apparatus for aligning a substrate received by moving a substrate support along the substrate from an outside of an outer periphery of a substrate toward a central portion, in which the substrate aligning apparatus aligns the substrate such that the substrate support moves from a position different from a position partially upwardly warped along an outer peripheral edge and a position partially downwardly warped position along the outer peripheral edge of the substrate toward the central portion of the substrate so as to receive the substrate.

Further, the present disclosure provides a substrate processing system including a substrate receiving apparatus for receiving a substrate by moving a substrate support along the substrate from an outside of an outer periphery of a substrate toward a central portion, in which the substrate receiving apparatus moves the substrate support from a position different from a position partially upwardly warped along an outer peripheral edge of the substrate and a position partially downwardly warped position along the outer peripheral edge of the substrate toward the central portion of the substrate.

Further, the present disclosure provides a substrate liquid processing apparatus for collectively immersing a plurality of substrates, which are aligned at intervals, in a processing liquid to process the plurality of substrates, in which the substrate liquid processing apparatus immerses the plurality of substrates in the processing liquid in a state where positions partially upwardly warped along outer peripheral edges of the substrates or positions partially downwardly warped the outer peripheral edges of the substrates are arranged in order.

In the above-described substrate processing system, the substrate is deformed in a substantially saddle-shaped curved form in which a portion partially upwardly warped along the outer peripheral edge of the substrate and a portion partially downwardly warped along the outer peripheral edge are symmetrically formed.

Further, in the present disclosure, the substrate processing system includes any one of the substrate aligning apparatus, the substrate receiving apparatus, and the substrate liquid processing apparatus.

According to the present disclosure, even though the substrate is warped, the substrate may be satisfactorily received on the substrate support. Thus, the substrate may be satisfactorily processed.

Hereinafter, a specific configuration of the substrate processing system according to the present disclosure will be described with reference to the drawings.

As illustrated in FIG. 1, the substrate processing system 1 includes a carrier carry-in/out section 2, a lot forming section 3, a lot placing section 4, a lot conveying section 5, a lot processing section 6, and a controller 7.

The carrier carry-in/out section 2 performs carry-in and carry-out of a carrier 9 that accommodates a plurality of (e.g., 25) substrates (silicon wafers) 8 vertically arranged in a horizontal posture.

The carrier carry-in/out section 2 includes a carrier stage 10 on which a plurality of carriers 9 are placed, a carrier conveying mechanism 11 that conveys the carriers 9, carrier stocks 12, 13 that temporarily store the carriers 9, and a carrier placing table 14 on which the carries 9 are placed. Here, the carrier stock 12 temporarily stores the substrates 8 to be fabricated as products before the substrates are processed in the lot processing section 6. Further, the carrier stock 13 temporarily stores the substrates 8 to be fabricated as products after the substrates are processed in the lot processing section 6.

Additionally, the carrier carry-in/out section 2 conveys the carriers 9 carried into the carrier stage 10 from the outside, to the carrier stock 12 or the carrier placing table 14 by using the carrier conveying mechanism 11. Further, the carrier carry-in/out section 2 conveys the carriers 9 placed on the carrier placing table 14 to the carrier stock 13 or the carrier stage 10 by using the carrier conveying mechanism 11. The carriers 9 conveyed to the carrier stage 10 are carried out to the outside.

The lot forming section 3 combines the substrates 8 accommodated in one or more carriers 9 to form a "lot" constituted by a plurality of (e.g., 50) substrates 8, which will be then processed simultaneously. When forming a lot, the lot may be formed such that pattern-formed surfaces of the substrates 8 face each other, or such that all the pattern-formed surfaces of the substrates 8 are directed to one side.

The lot forming section 3 includes a substrate conveying mechanism 15 that conveys a plurality of substrates 8, and a wafer aligner 16 that aligns the substrates 8 by arranging reference positions (e.g., positions of notches) in order by rotating the substrates 8. The substrate conveying mechanism 15 may change the posture of the substrates 8 from the horizontal posture to the vertical posture and vice versa during the conveyance of the substrates 8.

In addition, the lot forming section 3 conveys the substrates 8 from the carriers 9 placed on the carrier placing table 14 to the lot placing section 4 by using the substrate conveying mechanism 15, and forms a lot to be collectively processed in the lot placing section 4. Further, the lot forming section 3 conveys the substrates 8 forming the lot placed on the lot placing section 4 to the carriers 9 placed on the carrier placing table 14. In the lot forming section 3, the substrates 8 are aligned using the wafer aligner 16 during the conveyance of the substrates 8 from the carrier placing table 14 to the lot placing section 4, as necessary. Further, the substrate conveying mechanism 15 includes, for example, as substrate supports for supporting the plurality of substrates 8, two types of substrate supports, that is, to-be-processed substrate supports that support substrates 8 before the substrates 8 are processed (before the substrates 8 are conveyed from the lot conveying section 5), and processed substrate supports that support substrates 8 after the substrates 8 have been processed (after the substrates 8 have been conveyed from the lot conveying section 5). Therefore, for example, particles attached to the to-be-processed substrates 8 are suppressed from being transferred and attached to the processed substrates 8. Further, the substrate conveying mechanism 15 is not limited to this, but may support the to-be-processed substrates 8 and the processed substrates 8 on one type of substrate supports.

The lot placing section 4 temporarily places thereon (awaits) the lot conveyed between the lot forming section 3 and the lot processing section 6 by the lot conveying section 5.

The lot placing section 4 includes a carry-in side lot placing table 17 that places a lot before the lot is processed (before the lot is conveyed from the lot conveying section 5), and a carry-out side lot placing table 18 that places a lot after the has been processed (after the lot has been conveyed from the lot conveying section 5). On each of the carry-in side lot placing table 17 and the carry-out side lot placing table 18, a plurality of substrates 8 of one lot are placed back and forth in the vertical posture. On each of the carry-in side lot placing table 17 and the carry-out side lot placing table 18, a plurality of substrates 8 forming a lot are placed at intervals that are half the intervals in a state of being accommodated in the carrier 9.

Then, the lot formed in the lot forming section 3 is placed on the carry-in side lot placing table 17 in the lot placing section 4, and the lot is carried into the lot processing section 6 via the lot conveying section 5. Further, the lot carried out from the lot processing section 6 via the lot conveying section 5 is placed on the carry-out side lot placing table 18, and the lot is conveyed to the lot forming section 3.

The lot conveying section 5 conveys the lot between the lot placing section 4 and the lot processing section 6 or inside the lot processing section 6.

The lot conveying section 5 includes a lot conveying mechanism 19 that conveys the lot. The lot conveying mechanism 19 includes a rail 20 disposed along the lot placing section 4 and the lot processing section 6, and a moving body 21 movable on the rail 20 while holding the plurality of substrates 8. In the moving body 21, a substrate holder 22 is provided to freely advance and retreat and configured to hold the plurality of substrates 8 arranged back and forth in the vertical posture.

Then, the lot conveying section 5 receives the lot placed on the carry-in side lot placing table 17 with the substrate holder 22 of the lot conveying mechanism 19, and delivers the lot to the lot processing section 6. Further, the lot conveying section 5 receives the lot processed in the lot processing section 6 with the substrate holder 22 of the lot conveying mechanism 19, and delivers the lot to the carry-out side lot placing table 18. Further, the lot conveying section 5 conveys the lot inside the lot processing section 6 by using the lot conveying mechanism 19.

The lot processing section 6 performs a processing such as, for example, etching, cleaning, or drying on the plurality of substrates 8, which are arranged back and forth in the vertical posture, as one lot.

The lot processing section 6 includes a drying processing apparatus 23 that performs a dry processing on the substrates 8, a substrate holder cleaning processing apparatus 24 that performs a cleaning processing on the substrate holder 22, a cleaning processing apparatus 25 that performs a cleaning processing on the substrates 8, and two etching processing apparatuses 26 that perform an etching processing on the substrates 8.

The drying processing apparatus 23 includes a processing bath 27 and a substrate elevating mechanism 28 elevatably provided in the processing bath 27. A drying processing gas (e.g., isopropyl alcohol (IPA)) is supplied into the processing bath 27. In the elevating mechanism 28, a plurality of substrates 8 of one lot are held to be arranged back and forth in the vertical posture. The drying processing apparatus 23 receives the lot from the substrate holder 22 of the lot conveying mechanism 19 with the substrate elevating mechanism 28, and elevates the lot by the substrate elevating mechanism 28 to perform a dry processing on the substrates 8 with the drying processing gas supplied into the processing bath 27. Further, the drying processing apparatus 23 delivers the lot from the substrate elevating mechanism 28 to the substrate holder 22 of the lot conveying mechanism 19.

The substrate holder cleaning processing apparatus 24 is able to supply a cleaning processing liquid and a drying gas into a processing bath 29. Accordingly, the substrate holder cleaning processing apparatus 24 supplies the cleaning processing liquid and then supplies the drying gas onto the substrate holder 22 of the lot conveying mechanism 19, thereby performing a cleaning processing on the substrate holder 22.

The cleaning processing apparatus 25 includes a cleaning processing bath 30 and a rinse processing bath 31. The processing baths 30 and 31 include substrate elevating mechanisms 32 and 33 which are elevatable therein, respectively. A cleaning processing liquid (e.g., SC-1) is stored in the cleaning processing bath 30. A rinse processing liquid (e.g., deionized water) is stored in the rinse processing bath 31.

The cleaning processing apparatus 26 includes an etching processing bath 34 and a rinse processing bath 35. The processing baths 34 and 35 include substrate elevating mechanisms 36 and 37 which are elevatable therein, respectively. An etching processing liquid (e.g., a phosphoric acid aqueous solution) is stored in the etching processing bath 34. A rinse processing liquid (e.g., deionized water) is stored in the rinse processing bath 35.

The cleaning processing apparatus 25 and the etching processing apparatuses 26 have the same configuration as each other. Referring to the etching processing apparatus 26, each of the substrate elevation mechanisms 36 and 37 holds a plurality of substrates 8 of one lot arranged back and forth in the vertical posture. The etching processing apparatus 26 receives the lot from the substrate holder 22 of the lot conveying mechanism 19 with the substrate elevating mechanism 36, and elevates the lot by the substrate elevating mechanism 36 to immerse the lot in the etching processing liquid in the processing bath 34, thereby performing an etching processing on the substrates 8. Then, the etching processing apparatus 26 delivers the lot from the substrate elevating mechanism 36 to the substrate holder 22 of the lot conveying mechanism 19. Further, the etching processing apparatus 26 receives the lot from the substrate holder 22 of the lot conveying mechanism 19 with the substrate elevating mechanism 37, and elevates the lot by the substrate elevating mechanism 37 to immerse the lot in the rinse processing liquid in the processing bath 35, thereby performing a rinse processing on the substrates 8. Then, the etching processing apparatus 26 delivers the lot from the substrate elevating mechanism 37 to the substrate holder 22 of the lot conveying mechanism 19.

The controller 7 controls the operations of the respective sections of the substrate processing system 1 (e.g., the carrier carry-in/out section 2, the lot forming section 3, the lot placing section 4, the lot conveying section 5, and the lot processing section 6).

The controller 7 is, for example, a computer, and includes a computer-readable storage medium 38. The storage medium 38 stores a program that controls various processings performed in the substrate processing system 1. The control unit 7 controls the operations of the substrate processing system 1 by reading and executing the program stored in the storage medium 38. Further, the program may be stored in the computer-readable storage medium 38 or may be installed from another storage medium to the storage medium 38 of the controller 7. The computer-readable recording medium 38 may be, for example, a hard disc (HD), a flexible disc (FD), a compact disc (CD), a magnet optical disc (MO), or a memory card.

The substrate liquid processing apparatus 1 is configured as described above, and is controlled by the controller 7 as described below to process the substrates 8.

First, the substrate processing system 1 forms a lot to be collectively subjected to, for example, a liquid processing (lot forming step).

In the lot forming step, the substrate processing system 1 carries the carrier 9 accommodating a plurality of (e.g., 25) substrates 8 from the carrier stage 10 or the carrier stock 12 to the carrier placing table 14 by using the carrier conveying mechanism 11 in the carrier carry-in/out section 2 (carrier carry-in step S1).

Then, the substrate processing system 1 receives the plurality of substrates 8 accommodated in the carrier 9 by using the substrate conveying mechanism 15 in the lot forming section 3, and conveys the plurality of substrates 8 to the wafer aligner 16 (substrate reception step S2).

Then, the substrate processing system 1 aligns the plurality of substrates 8 by using the wafer aligner 16 (substrate alignment step S3).

Then, the substrate processing system 1 receives the plurality of substrates 8 from the wafer aligner 16 by using the substrate conveying mechanism 15, and delivers the plurality of substrates 8 to the carry-in side lot placing table 17 (substrate delivery step S4).

The substrate processing system 1 performs a carrier carry-in step S5, a substrate reception step S6, a substrate alignment step S7, a substrate delivery step S8, which are the same steps as those described above, on a plurality of (e.g., 25) substrates accommodated in another carrier 9. The plurality of substrates 8 delivered in the second substrate delivery step S8 are inserted into the plurality of substrates 8 delivered in the first substrate delivery step S4. Thus, a lot to be collectively processed is formed with a plurality of (e.g., 50) substrates 8 conveyed in twice, on the carry-in side lot placing table 17 of the lot placing section 4. On the carry-in side lot placing table 17, a plurality of substrates 8 forming a lot are placed at intervals that are half the intervals in a state of being accommodated in the carrier 9. The lot may be formed with substrates 8 accommodated in a single carrier 9 without performing the steps from the carrier carry-in step S5 to the substrate delivery step S8 for the second time, or may be formed with substrates 8 accommodated in a plurality of carriers 9 by repeatedly performing the steps from the carrier carry-in step to the substrate delivery step S8. Further, the substrates 8 may be conveyed from the carrier placing table 14 directly to the carrier-in side lot placing table 17 by the substrate conveying mechanism 15 without performing the substrate alignment steps S3 and S7.

The substrates 8 accommodated in the carrier 9 are changed in posture from the horizontal posture to the vertical posture, and placed on the carry-in side lot placing table 17.

Then, the substrate processing system 1 carries a plurality of (e.g., 50) substrates 8 forming a lot from the carry-in side lot placing table 17 of the lot placing section 4 into the etching processing apparatus 26 of the lot processing section 6 by using the lot conveying mechanism 19 in the lot conveying section 5 (lot carry-in step S9). The lot is carried into the substrate elevating mechanism 36 of the etching processing apparatus 26.

Next, the substrate processing system 1 collectively processes the plurality of substrates 8 forming the lot (lot processing step).

In the lot processing step, the substrate processing system 1 performs an etching processing on the substrates 8 forming the lot (etching processing step S10). In the etching processing step S10, the substrate elevating mechanism 36 of the etching processing apparatus 26 is moved down, and then moved up after the lapse of a predetermined time period, to immerse the lot in an etching processing liquid stored in the processing bath 34.

Then, the substrate processing system 1 conveys the lot between the processing baths 34 and 35 of the etching processing apparatus 26 (inter-bath conveyance step S11). In the inter-bath conveyance step S11, the lot held by the substrate elevating mechanism 36 of the etching processing bath 34 is conveyed to the substrate elevating mechanism 37 of the rinse processing bath 35 by using the lot conveying mechanism 19.

Then, the substrate processing system 1 performs a rinse processing on the substrates 8 forming the lot (rinse processing step S12). In the rinse processing step S12, the substrate elevating mechanism 37 of the etching processing apparatus 26 is moved down, and then moved up after the lapse of a predetermined time period, to immerse the lot in a rinse processing liquid stored in the processing bath 35.

Then, the substrate processing system 1 conveys the lot between the etching processing apparatus 26 and the cleaning processing apparatus 25 (inter-apparatus conveyance step S13). In the inter-apparatus conveyance step S13, the lot held by the substrate elevating mechanism 37 of the etching processing apparatus 26 is conveyed to the substrate elevating mechanism 32 of the cleaning processing apparatus 25 by using the lot conveying mechanism 19.

Then, the substrate processing system 1 performs a cleaning processing on the substrates 8 forming the lot (cleaning processing step S14). In the cleaning processing step S14, the substrate elevating mechanism 32 of the etching processing apparatus 25 is moved down, and then moved up after the lapse of a predetermined time period, to immerse the lot in a cleaning processing liquid stored in the processing bath 30.

Then, the substrate processing system 1 conveys the lot between the processing baths 30 and 31 of the cleaning processing apparatus 25 (inter-bath conveyance step S15). In the inter-bath conveyance step S15, the lot held by the substrate elevating mechanism 32 of the cleaning processing bath 30 is conveyed to the substrate elevating mechanism 33 of the rinse processing bath 31 by using the lot conveying mechanism 19.

Then, the substrate processing system 1 performs a rinse processing on the substrates 8 forming the lot (rinse processing step S16). In the rinse processing step S16, the substrate elevating mechanism 33 of the cleaning processing apparatus 25 is moved down, and then moved up after the lapse of a predetermined time period, to immerse the lot in a rinse processing liquid stored in the processing bath 31.

Then, the substrate processing system 1 conveys the lot between the cleaning processing apparatus 25 and the drying processing apparatus 23 (inter-apparatus conveyance step S17). In the inter-apparatus conveyance step S17, the lot held by the substrate elevating mechanism 33 of the cleaning processing apparatus 25 is conveyed to the substrate elevating mechanism 28 of the drying processing apparatus 23 by using the lot conveying mechanism 19.

Then, the substrate processing system 1 performs a drying processing on the substrates 8 forming the lot (drying processing step S18). In the drying processing step S18, the substrate elevating mechanism 28 of the drying processing apparatus 23 is moved down, and then moved up after the lapse of a predetermined time period, to supply a drying processing gas to the lot in the processing bath 27.

In this manner, the substrate processing system 1 performs the etching processing to the drying processing on a plurality of substrates 8 forming the lot collectively at the same time.

Next, in the substrate processing system 1, the plurality of substrates 8 forming the lot is accommodated in the carrier 9 (carrier accommodation step).

In the carrier accommodation step, the substrate processing system 1 carries the plurality of substrates 8 forming the lot from the drying processing apparatus 23 to the carry-out side lot placing table 18 by using the lot conveying mechanism 19 in the lot conveying section 5 (lot carry-out step S19).

Then, the substrate processing system 1 receives the plurality of (e.g., 25) substrates 8 from the carry-out side lot placing table 18 by using the substrate conveying mechanism 15 (substrate reception step S20).

Then, the substrate processing system 1 delivers the plurality of substrates 8 to the carrier 9 placed on the carrier placing table 14 by using the substrate conveying mechanism 15 (substrate delivery step S21).

Then, the substrate processing system 1 carries the carrier 9 from the carrier placing table 14 to carrier stage 10 or the carrier stock 13 by using the carrier conveying mechanism 11 in the carrier carry-in/out section 2 (carrier carry-out step S22).

The substrate processing system 1 performs a substrate reception step S23, a substrate delivery step S24, and a carrier carry-out step S25, which are the same steps as those described above, on the remaining plurality of (e.g., 25) substrates. Therefore, a plurality of (e.g., 50) substrates 8 forming the lot are accommodated in two carriers 9 by, for example, 25 substrates. The substrates 8 may be accommodated in a single carrier 9 without performing steps from the substrate reception step S23 to the carrier carry-out step S25 for the second time, or may be accommodated in a plurality of carriers 9 by repeatedly performing the steps from the substrate reception step S23 to the carrier carry-out step S25. The substrates 8 accommodated in the carry-out side lot placing table 18 are changed in posture from the vertical posture to the horizontal posture, and placed on the carrier 9.

As described above, in the substrate processing system 1, a plurality of substrates 8 are aligned, conveyed (received or delivered) at once, and processed at once.

Figure 3A:
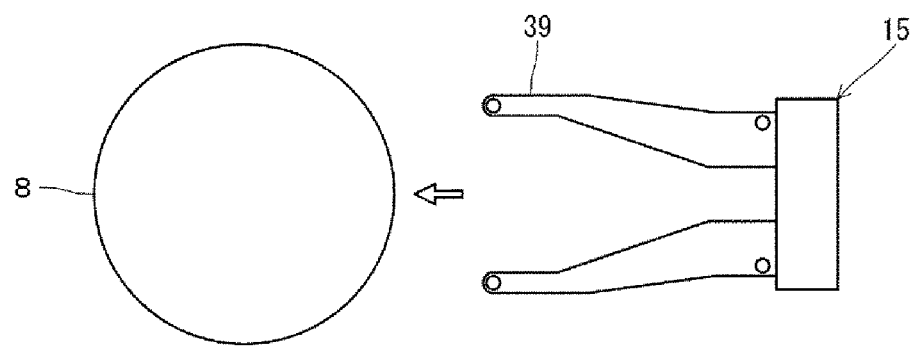
FIG. 3A is an explanatory plan view and illustrating receiving substrates.
Figure 3B:
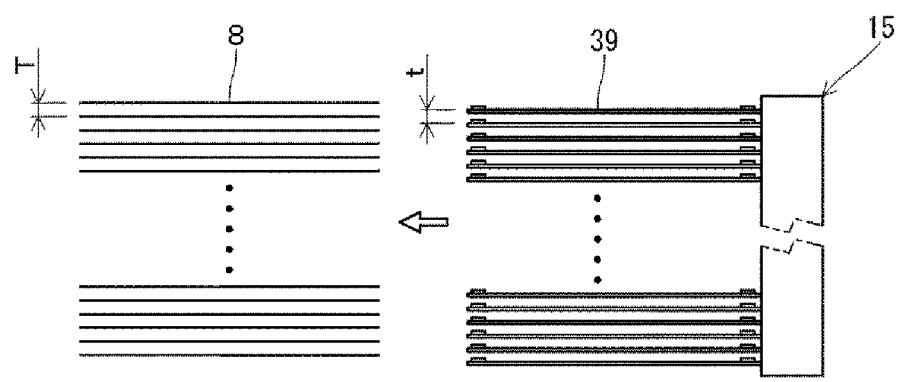
FIG. 3B is an explanatory side view thereof.

As schematically illustrated in FIGS. 3A and 3B, the plurality of substrates 8 are aligned in parallel at predetermined intervals T, accommodated in the carrier 9 in a horizontal posture at vertical intervals, and placed on the carry-in side lot placing table 17 and the carry-out side lot placing table 18 in a vertical posture at longitudinal intervals. Meanwhile, in the substrate conveying mechanism 15 that conveys the substrates 8 between the carrier 9 and the carry-in side lot placing table 17 or the carry-out side lot placing table 18, a plurality of (e.g., 25) substrate supports 39 are arranged in parallel at predetermined intervals t (t=T). Additionally, the substrate conveying mechanism 15 moves the plurality of substrate supports 39 from the outside of the outer periphery of substrates 8 toward the central portion of the substrates 8 linearly along the substrates 8 (substantially in parallel with the front surface or the rear surface of the substrates 8) so that the respective substrate supports 39 are inserted from the gaps between substrates 8 toward the central portions of the substrates 8, respectively. As the inserted substrate supports 39 are moved toward the substrates 8 (in a direction orthogonal to the front surface or the rear surface of the substrates 8), the substrates 8 are supported by the substrate supports 39, respectively.

When the substrates 8 aligned as described above are flat, the intervals T are kept constant. Thus, the substrate supports 39 may be smoothly inserted into the gaps between the substrates 8, respectively, without colliding with the substrates 8.

Figure 5:
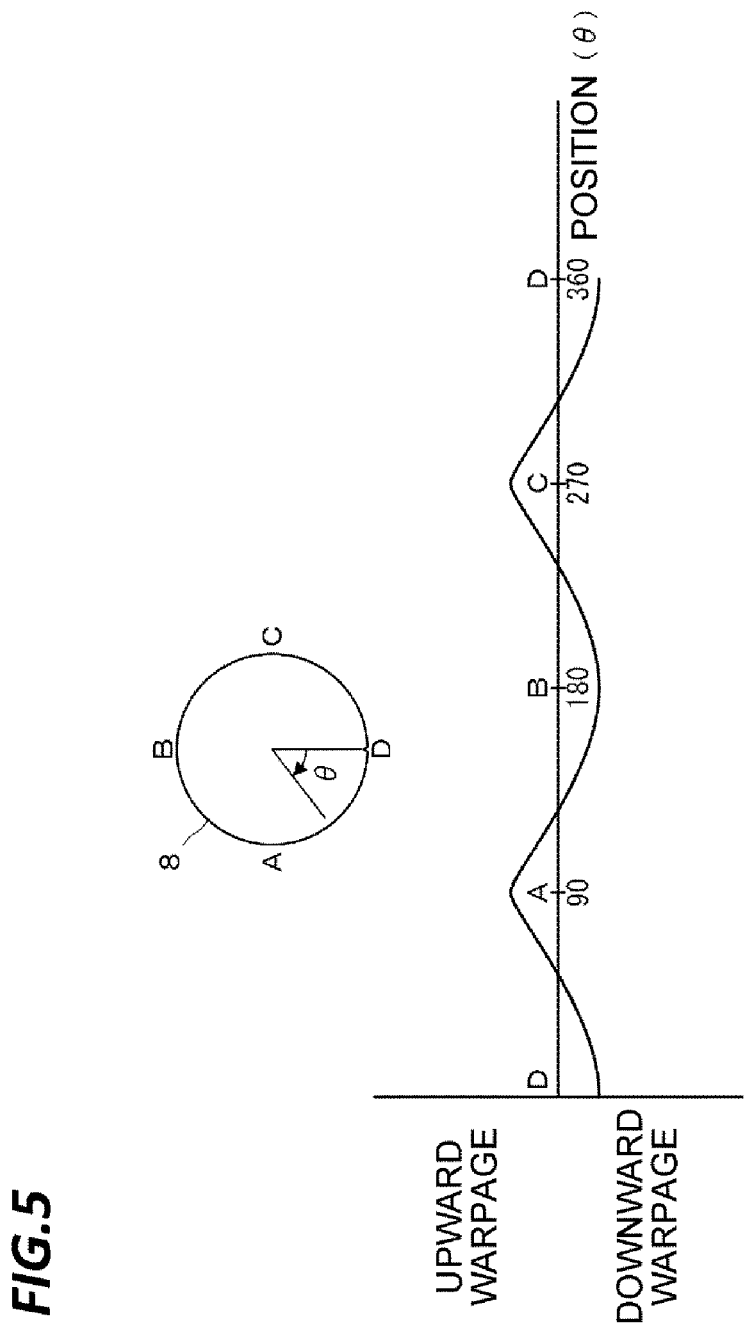
FIG. 5 is an explanatory view illustrating a measurement result of the warped state of the substrate.

However, the substrates 8 do not necessarily always remain flat. In the processing in the substrate processing system 1 or the processing before being carried into the substrate processing system 1, the substrates 8 undergo deformation from the flat state to a partially (locally) upwardly or downwardly warped state in the course of various processings. Conventionally, the substrates 8 deformed in a substantially bowl-shaped curved form have frequently been found in which the outer peripheral edges of the substrates 8 are warped upwardly (downwardly). Further, in a case where a substrate 8 is subjected to three-dimensional lamination which is recently performed in, for example, formation of 3D NANDs, as illustrated in FIGS. 4A to 4C and 5, it has been newly found that the substrate 8 is deformed in a substantially saddle-shaped curved form in which the partially upwardly warped positions (A and C) and the partially downwardly warped positions (B and D) along the outer peripheral edge are symmetrically formed. The substrate 8 is gradually warped from the central portion of the substrate 8 to the position A and the position C toward the upside (front surface side) as illustrated as contour lines indicated by alternate long and short dash lines in FIG. 4A, and gradually warped from the center of the substrate 8 to the position B and the position D toward the downside (rear surface side) as illustrated as contour lines indicated by alternate long and two short dashes lines in FIG. 4A. Thus, the substrate 8 is deformed in a saddle shape as a whole. In the substrate 8, for example, a position where a notch 40 is formed is warped down. When the height (warped amount) of the outer peripheral edge of the substrate 8 is measured from the position of the notch 40 along the outer peripheral edge of the substrate 8 in the circumferential direction, as illustrated in FIG. 5, the substrate 8 is gradually warped upwardly from the position D (angle θ=0°) toward the position A (θ=90°), partially (locally) warped upwardly at the position A, gradually warped downwardly from the position A (angle θ=90°) toward the position B (θ=180°), partially (locally) warped downwardly at the position B, gradually warped upwardly from the position B (angle θ=180°) toward the position C (θ=270°), partially (locally) warped upwardly at the position C, gradually warped downwardly from the position C (angle θ=270°) toward the position D (θ=360° (0°)), and partially (locally) warped downwardly at the position D. In the case where the substrates 8 are collectively processed as a lot, the substrates 8 are aligned by arranging the notches 40 in order and processed. Thus, it has been found that all the substrates 8 forming the lot are warped (deformed) with the same tendency (shape) on the basis of the notches 40.

The substrates 8 warped as described above may have the following problems. For example, when a plurality of substrates 8 are aligned in a horizontal posture in vertical intervals inside the carrier 9 such that the position B partially (locally) warped downwardly along the outer peripheral edge of each of the substrates 8 is directed to the substrate support 39 side, the downward warpage of the portion at the position B partially (locally) warped downwardly along the outer peripheral edge of each of the substrates 8 increases. Thus, when the supports 39 are inserted to receive the substrates 8, a contact (collision) may be caused between the substrates 8 and the substrate supports 39. Therefore, the substrates 8 may not be satisfactorily received. Further, for example, when a plurality of substrates 8 are aligned in a vertical posture in longitudinal intervals on the carry-in side lot placing table 17 or the carry-out side lot placing table 18 such that the position B partially (locally) warped downwardly along the outer peripheral edge of each of the substrates 8 is directed upright, a large inclination may occur in the substrates 8 of the vertical posture. When the substrates 8 are received with the substrate supports 39 in that state, the substrates 8 and the substrate supports 39 may come into contact (collide) with each other. Thus, the substrates 8 may not be satisfactorily received. Further, during the lot formation, since the plurality of substrates 8 forming the lot are aligned at intervals that are half the intervals in a state of being accommodated in the carrier 9 (T/2), the substrates 8 may come into contact (collide) with each other, thereby causing damage to the substrates 8. Specifically, when the lot is formed such that pattern-formed planes on the surfaces of the substrates 8 face each other, the contact (collision) may be remarkably caused between the substrates 8. The above-described problems are not limited to the case where a plurality of warped substrates 8 are arranged and aligned, but may also arise in a case of a single substrate 8.

Figure 6:
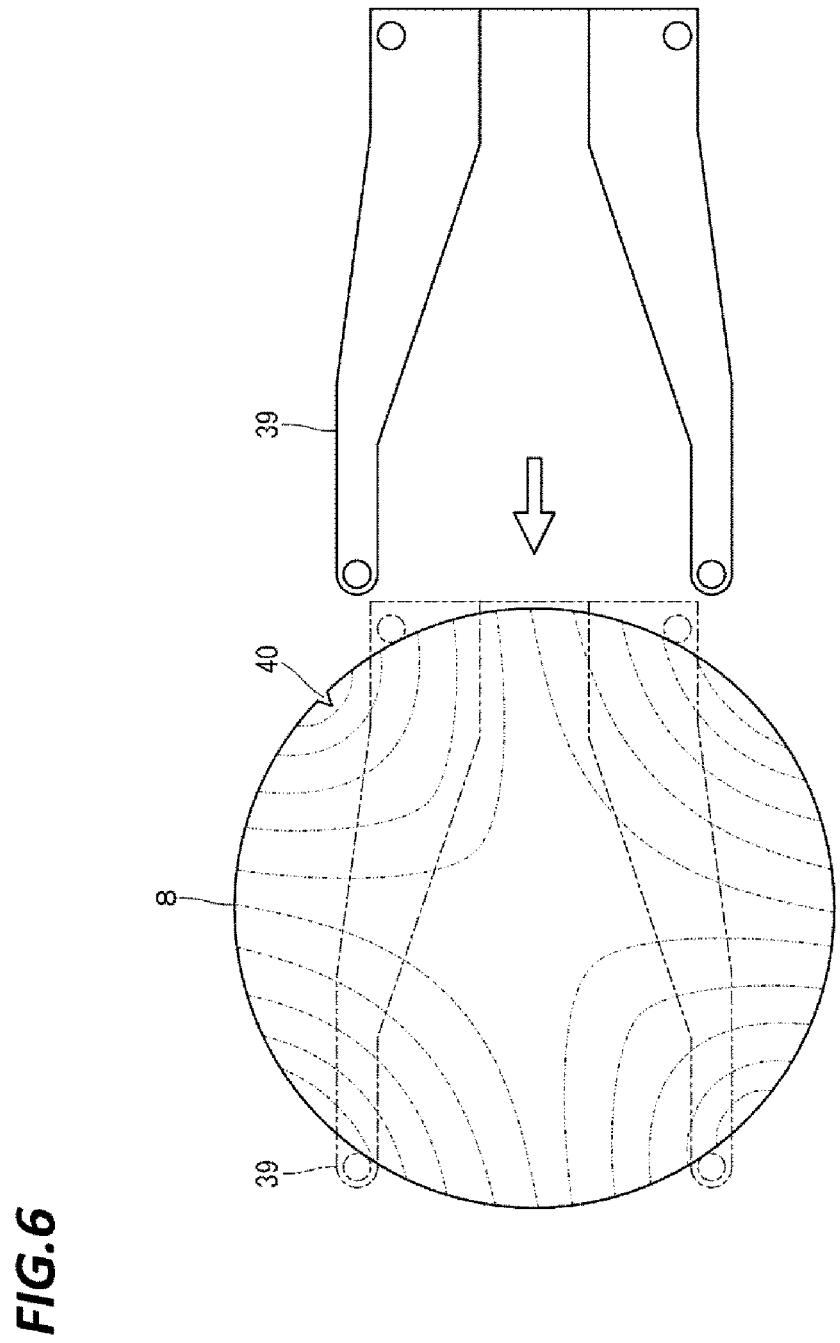
FIG. 6 is an explanatory plan view illustrating receipt of the substrate.

Therefore, as illustrated in FIG. 6, the substrate conveying mechanism 15 of the substrate processing system 1 is configured such that a substrate support 39 is inserted from a position different from the positions A and C and the positions B and D, which are partially (locally) upwardly and downwardly warped along the outer peripheral edge of the substrate 8, respectively, toward the central portion of the substrate 8. The position where the substrate support 39 is inserted may be any position as long as it is different from the positions A and C and the positions B and D, which are partially (locally) upwardly and downwardly warped along the outer peripheral edge of the substrate 8, respectively. However, the substrate support 39 may be inserted at a position in the middle of the positions A and C and the positions B and D, which are partially (locally) upwardly and downwardly warped along the outer peripheral edge of the substrate 8, respectively.

Thus, in the substrate processing system 1, a plurality of substrates 8 are aligned using the wafer aligner 16 in the substrate alignment steps S3 and S7 such that the substrate supports 39 are inserted from a position different from the positions A and C and the positions B and D, which are partially (locally) upwardly and downwardly warped along the outer peripheral edges of the substrates 8, respectively, toward the central portions of the substrates 8 to receive the substrates 8. For example, the deformed state of each of the substrates 8 along the outer peripheral edge thereof is measured as illustrated in FIG. 5 to detect the partially upwardly warped positions A and C and the partially warped positions B and D. Then, the substrates 8 are rotated one by one to be aligned such that the middle positions of those positions becomes the insertion positions of the substrate supports 39, respectively. The measurement of the deformed state of the substrates 8 may be performed within the substrate processing system 1, or may be performed in advance before the conveyance to the substrate processing system 1. In addition, since a plurality of simultaneously processed substrates 8 tend to be similarly deformed, only one substrate 8 may be measured and the remaining substrates 8 may be aligned by arranging the positions of the notches 40 in order. Further, without being limited to the case of aligning the substrates 8 within the substrate processing system 1, the substrates 8 may be aligned in advance by an external wafer aligner 16a outside the substrate processing system 1 (see, e.g., FIG. 1), accommodated in the carrier 9, and then carried into the substrate processing system 1.

Therefore, in the substrate processing system 1, the substrate conveying mechanism 15 receives the substrates 8 by inserting the substrate supports 39 from a position different from the positions A and C and the positions B and D, which are partially (locally) upwardly and downwardly warped along the outer peripheral edges of the substrates 8, respectively, toward the central portions of the substrates 8. Further, in the drying processing apparatus 23, the cleaning processing apparatus 25, or the etching processing apparatus 26, the substrates 8 are processed in a state where the positions A and C or the positions B, D, which are partially upwardly or downwardly warped along the outer peripheral edge of the substrates 8, are arranged in order.

Accordingly, in the substrate processing system 1, even though warpage occurs in a plurality of substrates 8 aligned at intervals, it is possible to avoid a contact between the substrates 8 and the substrate supports 39 or a contact between the substrates 8. Therefore, a plurality of substrates 8 may be satisfactorily received by the substrate supports 39, and thus, the substrates 8 may be satisfactorily collectively processed.

In the substrate processing system 1, descriptions have been made on the substrate conveyance mechanism 15 which is provided with a plurality of (e.g., 25) substrate supports 39, and moves the plurality of substrate supports 39 from the outside of the outer peripheries of the substrates 8 toward the central portions, but not limited thereto. For example, the substrate conveying mechanism 15 may be configured to move at least one substrate support 39 among the plurality of substrate supports 39 from the outside of the outer periphery toward the central portion of a substrate 8. Alternatively, the substrate conveying mechanism 15 may be provided with only one substrate support 39 and moves the substrate support 39 from the outside of the outer periphery 8 toward the central portion of a substrate.

Further, in the substrate processing system 1, the wafer aligner 16 or the wafer aligner 16a corresponds to the substrate aligning apparatus according to the present disclosure. The substrate conveying mechanism 15 corresponds to the substrate receiving apparatus according to the present disclosure. The drying processing apparatus 23, the cleaning processing apparatus, or the etching processing apparatus corresponds to the substrate liquid processing apparatus according to the present disclosure.

Further, present disclosure is not limited to the substrates 8 which are deformed in a substantially saddle-shaped curved form in which the partially upwardly warped position and the partially downwardly warped position along the outer peripheral edge are repeatedly symmetrically formed, but may be applied to any substrates which are deformed such that a partially upwardly warped position and a partially downwardly warped position along the outer peripheral edge are formed.

Further, the present disclosure is not limited to the batch type processing apparatus which collectively processes a plurality of substrates 8, but may also be applied to a single type processing apparatus such as, for example, a spin processing apparatus which processes substrates 8 one by one.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate aligning method comprising:
providing a substrate support configured to carry a plurality of substrates, the substrate support including a plurality of pairs of arms, each pair of arms being configured to carry one of the plurality of substrates;
receiving deformation information of each of the plurality of substrates recorded in advance to identify positions of warped portions along an outer periphery edge of each of the plurality of substrates;
rotating the plurality of substrates relative to the substrate support according to the previously measured deformation information received at the receiving;
aligning the warped portions of each of the plurality of substrates identified by the deformation information received at the receiving to be offset relative to a front of the plurality of pairs of arms of the substrate support, and
moving each of the pairs of arms of the substrate support along each of the plurality of substrates from an outside of the outer periphery edge of each of the plurality of substrates toward a central portion thereof without being impeded by the warped portions of each of the plurality of substrates after the aligning.

2. A substrate liquid processing method comprising:
collectively immersing a plurality of substrates, which are aligned at intervals, in a processing liquid to process the plurality of substrates,
wherein the plurality of substrates are immersed in the processing liquid in a state where corresponding positions of warped portions along outer peripheral edges of the plurality of substrates are aligned using the substrate aligning method of claim 1.

3. The substrate liquid processing method of claim 2, wherein each of the plurality of substrates is deformed in a substantially saddle-shaped curved form in which a portion partially upwardly warped and a portion partially downwardly warped along the outer peripheral edge of each of the plurality of substrates are symmetrically formed.

4. The substrate aligning method of claim 1, wherein each of the plurality of substrates is deformed in a substantially saddle-shaped curved form in which a portion partially upwardly warped and a portion partially downwardly warped along the outer peripheral edge of each of the plurality of substrates are symmetrically formed.

\* \* \* \* \*